(12) United States Patent
Cai

(10) Patent No.: US 10,548,236 B2
(45) Date of Patent: Jan. 28, 2020

(54) SERVER CABINET AND SERVER SYSTEM

(71) Applicant: INSPUR ELECTRONIC INFORMATION INDUSTRY CO., LTD, Jinan, Shandong (CN)

(72) Inventor: Jimiao Cai, Shandong (CN)

(73) Assignee: INSPUR ELECTRONIC INFORMATION INDUSTRY CO., LTD., Jinan, Shandong (CN)

( * ) Notice: Subject to any disclaimer, the term of this patent is extended or adjusted under 35 U.S.C. 154(b) by 0 days.

(21) Appl. No.: 15/744,840

(22) PCT Filed: Dec. 13, 2016

(86) PCT No.: PCT/CN2016/109585
§ 371 (c)(1),
(2) Date: Jan. 15, 2018

(87) PCT Pub. No.: WO2018/040364
PCT Pub. Date: Mar. 8, 2018

(65) Prior Publication Data
US 2019/0014678 A1 Jan. 10, 2019

(30) Foreign Application Priority Data
Aug. 30, 2016 (CN) .......................... 2016 1 0761728

(51) Int. Cl.
*H05K 5/00* (2006.01)
*H05K 7/00* (2006.01)
(Continued)

(52) U.S. Cl.
CPC ......... *H05K 7/1489* (2013.01); *H05K 5/0204* (2013.01); *H05K 7/10* (2013.01); *H05K 7/1487* (2013.01); *H05K 7/183* (2013.01)

(58) Field of Classification Search
CPC ..................................................... H05K 5/00
See application file for complete search history.

(56) References Cited

U.S. PATENT DOCUMENTS

| 6,038,126 A * | 3/2000 | Weng ...................... G06F 1/189 |
| | | 312/223.2 |
| 7,907,402 B2 | 3/2011 | Caveney |

(Continued)

FOREIGN PATENT DOCUMENTS

| CN | 102541197 A | 7/2012 |
| CN | 102625608 A | 8/2012 |

(Continued)

OTHER PUBLICATIONS

International Search Report for PCT/CN2016/109585, dated Jun. 1, 2017, ISA/CN.

(Continued)

*Primary Examiner* — Jerry Wu
(74) *Attorney, Agent, or Firm* — Yue(Robert) Xu; Apex Attorneys at Law, LLP

(57) ABSTRACT

A server cabinet includes a left side wall panel, a right side wall panel, a rear side wall panel and at least one mounting plate. Each of the mounting plates is connected to the left side wall panel and the right side wall panel, and is configured to mount an external server node. A position limiting mechanism is provided on the rear side wall panel, and is configured to limit a relative position between the mounting plate and the external server node mounted on this mounting plate.

3 Claims, 7 Drawing Sheets

(51) Int. Cl.
　　　*H05K 7/14*　　　(2006.01)
　　　*H05K 5/02*　　　(2006.01)
　　　*H05K 7/10*　　　(2006.01)
　　　*H05K 7/18*　　　(2006.01)

(56) References Cited

U.S. PATENT DOCUMENTS

| | | |
|---|---|---|
| 2006/0274508 A1 | 12/2006 | Lariviere |
| 2008/0298004 A1* | 12/2008 | Bailey .................. H05K 7/1454 361/679.01 |
| 2013/0163198 A1* | 6/2013 | Li ........................ H05K 7/1492 361/679.58 |
| 2014/0085809 A1 | 3/2014 | Ning et al. |
| 2014/0368997 A1 | 12/2014 | Wang et al. |
| 2016/0165739 A1 | 6/2016 | Li |

FOREIGN PATENT DOCUMENTS

| | | |
|---|---|---|
| CN | 103179836 A | 6/2013 |
| CN | 103631344 A | 3/2014 |
| CN | 103677161 A | 3/2014 |
| CN | 104155724 A | 11/2014 |
| CN | 104244632 A | 12/2014 |
| CN | 104503548 A | 4/2015 |
| CN | 205068259 U | 3/2016 |

OTHER PUBLICATIONS

The 1st Office Action regarding Chinese Patent Application No. CN201610761728.5, dated Sep. 19, 2018. English Translation Provided by http://globaldossier.uspto.gov.

* cited by examiner

SERVER CABINET AND SERVER SYSTEM

CROSS-REFERENCE TO RELATED APPLICATIONS

This application is the national phase of International Application No. PCT/CN2016/109585, titled "SERVER CABINET AND SERVER SYSTEM", filed on Dec. 13, 2016, which claims the benefit of priority to Chinese patent application No. 201610761728.5 titled "SERVER CABINET AND SERVER SYSTEM", filed with the Chinese State Intellectual Property Office on Aug. 30, 2016, the entire disclosures of which are incorporated herein by reference.

FIELD

This application relates to the technical field of computers, and particularly to a server cabinet and a server system.

BACKGROUND

With the rapid development of computer technology, more and more large-scale cloud computing centers are developed, and in the cloud computing center, the degree of integration of server nodes is increasingly high, and thus for achieving unified power supply and heat dissipation for the server nodes, generally, it is necessary to arrange multiple server nodes in one server cabinet.

At present, when multiple server nodes are provided in one server cabinet, multiple sets of guide rails are provided on two side wall panels of the cabinet, and one mounting plate is mounted on each set of the guide rails and is movable forward and backward on the guide rails. One server node may be placed on each mounting plate, to allow the server node to move forward and backward in the cabinet, which greatly facilitates maintenance of the server nodes for the staff.

However, the server node is placed directly on the mounting plate, thus when the cabinet topples due to unexpected circumstances, it is possible to cause the server nodes to collide with the cabinet, and further cause damages to the server nodes, therefore, the server nodes have a low security.

SUMMARY

A server cabinet and a server system are provided according to embodiments of the present application, which can improve the security of server nodes.

In a first aspect, a server cabinet is provided according to an embodiment of the present application, which includes:

a left side wall panel, a right side wall panel, a rear side wall panel and at least one mounting plate, wherein, each of the at least one mounting plate is connected to both the left side wall panel and the right side wall panel, and is configured to mount an external server node, and a position limiting mechanism is provided on the rear side wall panel, and is configured to limit a relative position between the mounting plate and the external server node mounted on the mounting plate.

Preferably, the position limiting mechanism includes at least one set of position limiting holes provided at a designated position in the rear side wall panel, wherein, each set of the position limiting holes are configured to cooperate with guide pins on the external server node, to limit a distance from the external server node to the left side wall panel and a distance from the external server node to the right side wall panel, respectively.

Preferably, each set of the position limiting holes include a first position limiting hole and a second position limiting hole, wherein, a connection line connecting a center of the first position limiting hole and a center of the second position limiting hole is perpendicular to a horizontal plane, and a distance from the first position limiting hole to the horizontal plane is greater than a distance from the second position limiting hole to the horizontal plane, a diameter of the first position limiting hole is greater than 4 mm, and less than or equal to 4.2 mm, and a diameter of the second position limiting hole is greater than 5 mm, and less than or equal to 5.2 mm.

Preferably, the server cabinet further includes at least one set of guide rails, wherein, a first guide rail and a second guide rail in each set of the guide rails are arranged on the left side wall panel and the right side wall panel, respectively, and the first guide rail and the second guide rail in a same set of guide rails are spaced at equal distances from the horizontal plane, the at least one mounting plate and the at least one set of guide rails are connected in a one-to-one corresponding manner, and each of the at least one mounting plate is movable linearly toward the rear side wall panel or away from the rear side wall panel along the respective set of guide rails connected to this mounting plate under the action of an external force.

Preferably, the server cabinet further includes at least one stop protrusion provided on the left side wall panel or the right side wall panel, and the stop protrusion is configured to limit a distance from the server node mounted on the mounting plate to the rear side wall panel in a case that the mounting plate is moving toward the rear side wall panel along the respective set of the guide rails connected to this mounting plate.

Preferably, the rear side wall panel is provided with at least one connection hole, and the connection hole is configured to allow an external server node backboard to be connected to each external server node mounted on the at least one mounting plate through the at least one connection hole.

In a second aspect, a server system is provided according to an embodiment of the present application, which includes:

at least one server node, and a server cabinet according to any one of the above solutions.

Preferably, the server node includes a housing, a first guide pin, and a second guide pin, wherein, the first guide pin and the second guide pin are each a cylindrical structure having a circular cross section, the first guide pin is configured to engage with a first position limiting hole provided in the rear side wall panel of the server cabinet, and the second guide pin is configured to engage with a second position limiting hole provided in the rear side wall panel of the server cabinet.

Preferably, a diameter of the first guide pin is not less than 3.95 mm and not greater than 4.05 mm, and a diameter of the second guide pin is not less than 4.95 mm and not greater than 5.05 mm.

Preferably, the server system further includes a server node backboard, and the server node backboard is connected to each of the server nodes.

A server cabinet and a server system are provided according to the embodiments of the present application. In the server cabinet, at least one mounting plate is connected between the left side wall panel and the right side wall panel, and a server node may be mounted on each mounting plate, and the position limiting mechanism provided on the rear side wall panel can limit the relative position between the server node mounted on the mounting plate and this mounting plate. Therefore, the server node will not move on the respective mounting plate, which prevents the server node from colliding with the left side wall panel and the right side wall panel of the server cabinet, and improves the security of the server node.

BRIEF DESCRIPTION OF THE DRAWINGS

For more clearly illustrating embodiments of the present application or the technical solutions in the conventional technology, drawings referred to describe the embodiments or the conventional technology will be briefly described hereinafter. Apparently, the drawings in the following description are examples of the present application, and for the person skilled in the art, other drawings may be obtained based on the drawings without any creative efforts.

DETAILED DESCRIPTION

For making the objects, technical solutions and advantages of the embodiments of the present application more clear, the technical solutions in the embodiments of the present application will be described clearly and completely hereinafter in conjunction with the drawings in the embodiments of the present application. Apparently, the described embodiments are one part of the embodiments of the present application, rather than all embodiments. Based on the embodiments in the present application, all of other embodiments, made by the person skilled in the art without any creative efforts, fall into the scope of protection of the present application.

Figure 1:
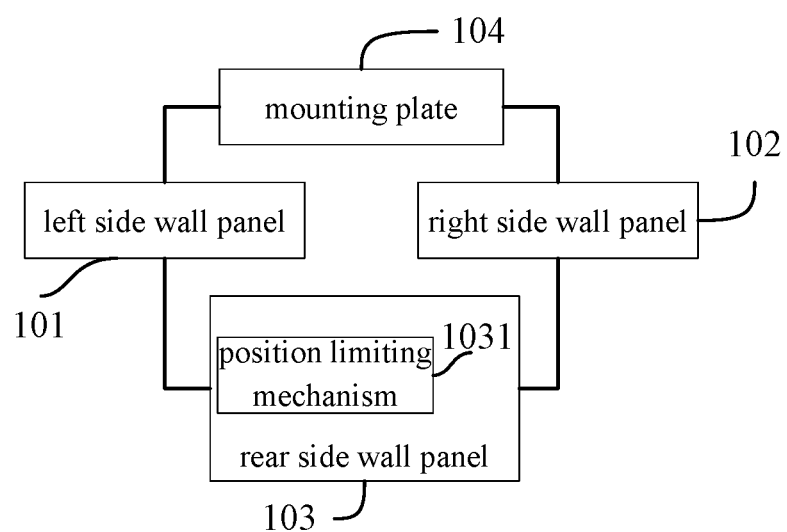
FIG. 1 is a schematic view showing the structure of a server cabinet according to an embodiment of the present application.
Figure 8:
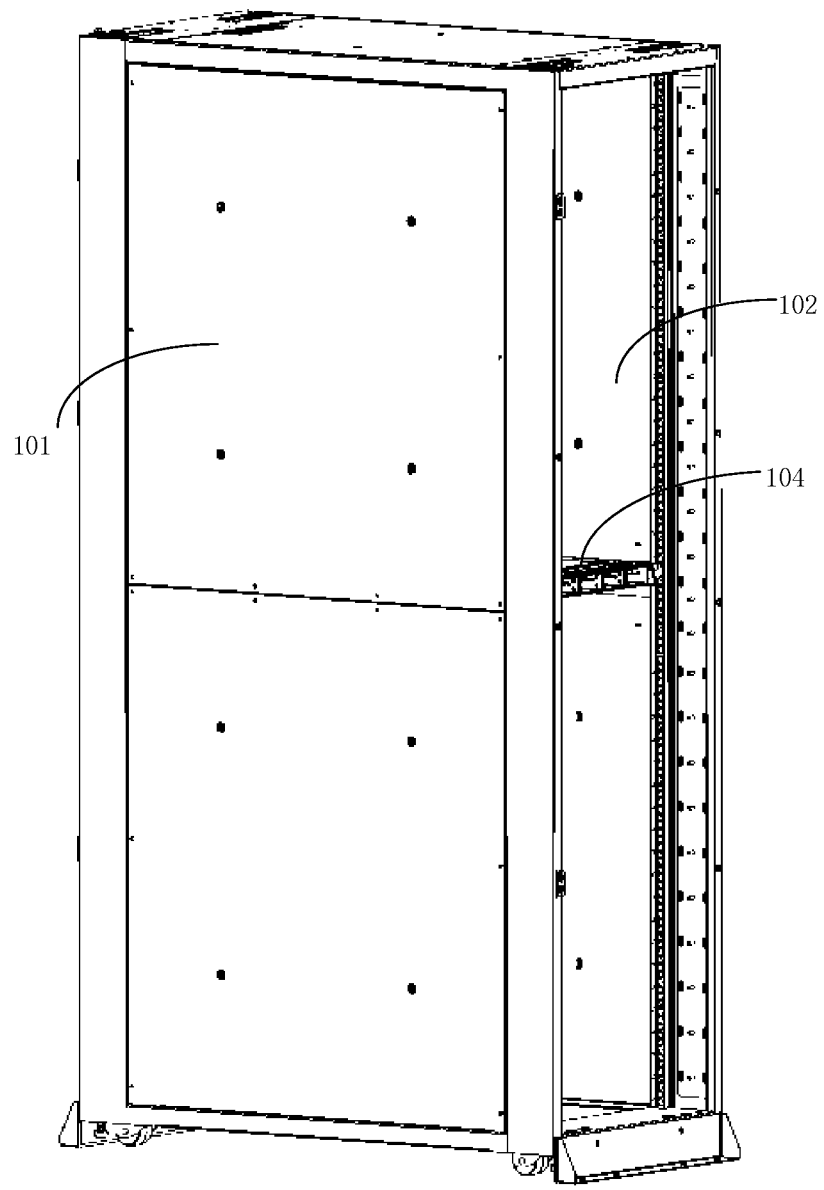
FIG. 8 is a schematic view showing the structure of a server cabinet according to an embodiment of the present application.
Figure 9:
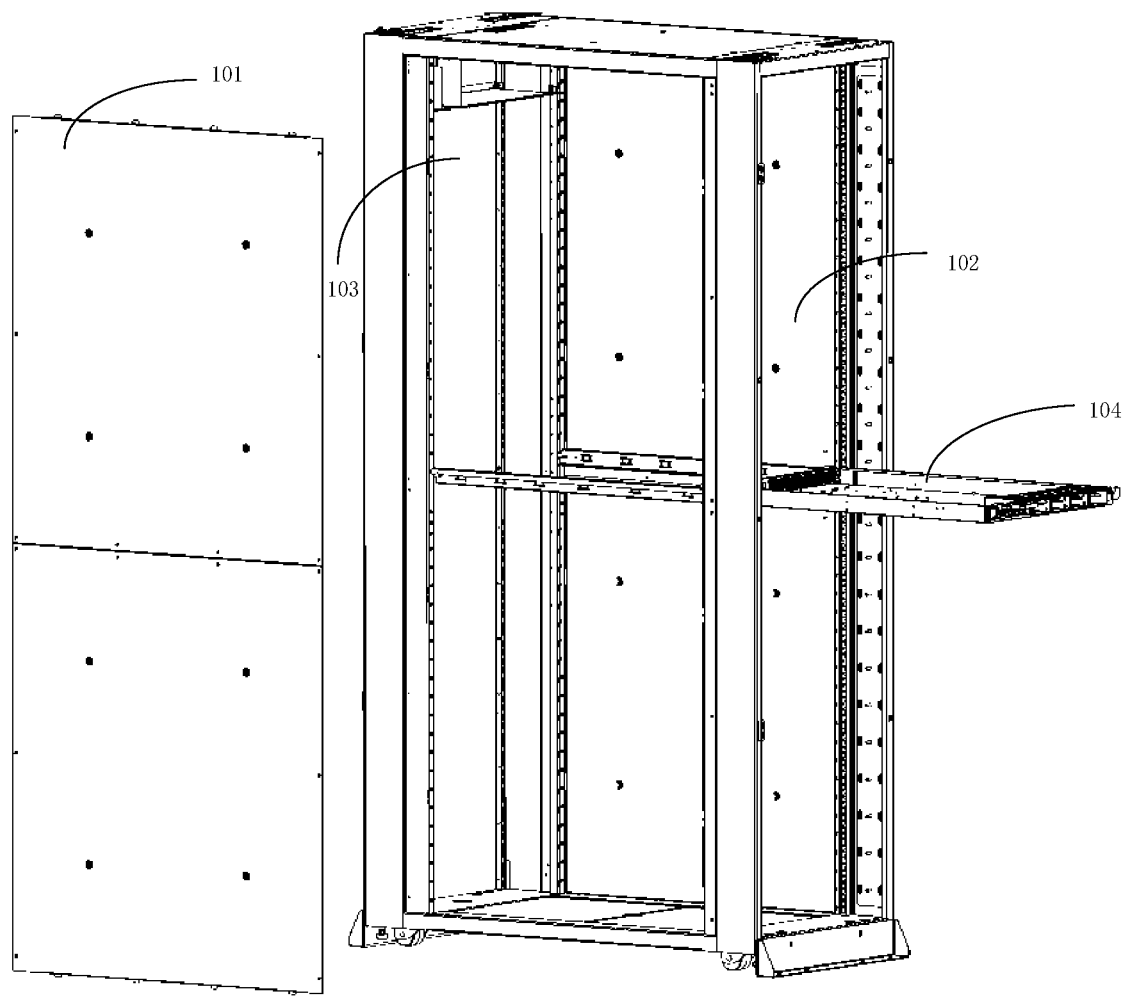
FIG. 9 is an exploded schematic view showing the structure of a server cabinet according to an embodiment of the present application.

As shown in FIGS. 1, 8 and 9, a server cabinet is provided according to an embodiment of the present application, which includes a left side wall panel 101, a right side wall panel 102, a rear side wall panel 103, and at least one mounting plate 104.

Each mounting plate 104 is connected to both the left side wall panel 101 and the right side wall panel 102 and is configured to mount an external server node.

A position limiting mechanism 1031 is provided on the rear side wall panel 103 and is configured to limit the relative position between the mounting plate 104 and the external server node mounted on this mounting plate 104.

In the above embodiment of the present application, at least one mounting plate is connected between the left side wall panel and the right side wall panel, and the server node can be mounted on each of the mounting plates. The position limiting mechanism provided on the rear side wall panel can limit the relative position between the server node mounted on the mounting plate and this mounting plate. Therefore, the server node will not move on the respective mounting plate, which prevents the server node from colliding with the left side wall panel and the right side wall panel of the server cabinet, and improves the security of the server node.

In the case that the relative position between the server node and the respective mounting plate is limited by the position limiting mechanism, in a possible implementation, a corresponding physical component can be fixedly connected to the rear side wall panel, and the relative position between the server node and the mounting plate, on which this server node is mounted, can be limited by the physical component. In this implementation, it requires to occupy a certain space within the server cabinet, which will result in a smaller density of the server nodes within the server cabinet. In another possible implementation, the rear side wall panel having a designated shape and structure can directly cooperate with a designated physical mechanism of the server node mounted on the mounting plate, to limit the relative position between the server node and the mounting plate, without occupying the internal space of the server cabinet, and thus the server nodes within the server cabinet has a higher density and the computing capability is strong.

In particular, in order to improve the density of the server nodes in the server cabinet, in a preferred embodiment of the present application, the position limiting mechanism 1031 includes at least one set of position limiting holes provided at a designated position on the rear side wall panel 103.

Each set of the position limiting holes are configured to cooperate with guide pins on the external server node, to limit the distance between the current external server node and the left side wall panel 101 and the distance between the external server node and the right side wall panel 102.

For example, one server node generally includes a housing, and other components of the server node, including a processor, a hard disk and a mainboard, are arranged within the housing. A specific physical mechanism can be provided at the exterior of the housing, for example, one set of guide pins can be provided at the exterior of the housing, and when the server node is mounted through the mounting plate of the server cabinet, the guide pins provided on the housing can extend into the corresponding set of position limiting holes, to allow the guide pins to cooperate with the set of position limiting holes, to guide the housing to move in a right direction. Thus, the housing will not move toward the left side wall panel or the right side wall panel of the server cabinet on the corresponding mounting plate, that is, the distance between the server node and the left side wall panel of the server cabinet and the distance between the server node and the right side wall panel of the server cabinet are limited.

In the above embodiment of the present application, the specified position may include a region in which the distance from the center of the position limiting hole to an inner wall of the left side wall panel is not less than 10.6 mm and not greater than 11.17 mm.

Figure 2:
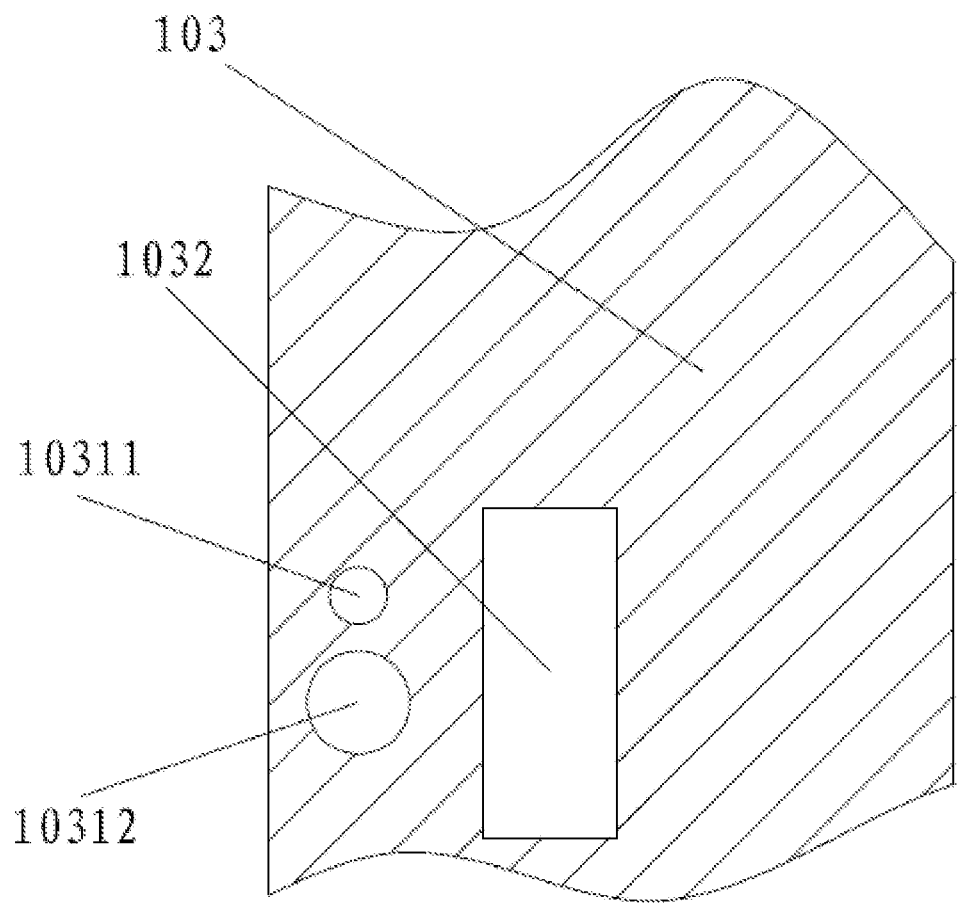
FIG. 2 is a schematic view showing the structure of a rear side wall panel in a server cabinet according to an embodiment of the present application.

Further, in order to facilitate the removal and installation of the server node, as shown in FIG. 2, in a preferred embodiment of the present application, each set of the position limiting holes include a first position limiting hole 10311 and a second position limiting hole 10312.

A connection line connecting the center of the first position limiting hole 10311 and the center of the second position limiting hole 10311 is perpendicular to the horizontal plane, and the distance from the first position limiting hole 10311 to the horizontal plane is greater than the distance from the second position limiting hole 10312 to the horizontal plane.

The diameter of the first position limiting hole 10311 is greater than 4 mm, and less than or equal to 4.2 mm.

The diameter of the second position limiting hole 10312 is greater than 5 mm, and less than or equal to 5.2 mm.

In the above embodiments of the present application, under the premise of ensuring that the first position limiting hole and the second position limiting hole can cooperate with the corresponding guide pins on the server node to prevent the server node to move toward the left side wall panel or the right side wall panel on the corresponding mounting plate, in one aspect, in order to facilitate the installation and removal of the server node, the guide pin on the server node can be configured to have a cylindrical structure, and correspondingly, the first position limiting hole and the second position limiting hole can be embodied as circular holes. In another aspect, in order to allow the guide pins of the server node engaged in the first position limiting hole and the second position limiting hole to be uniformly stressed when the server cabinet is tilted, the connection line connecting the centers of the first position limiting hole and the second position limiting hole may be perpendicular to the horizontal plane. In yet another aspect, in order to facilitate the removal of the server node, the diameter of each of the first position limiting hole and the second position limiting hole may be slightly greater than the diameter of the respective guide pin inserted therein respectively. In this way, when the server cabinet is normally placed, the guide pin engaged in the second position limiting hole is subjected to a greater force than the guide pin engaged in the first position limiting hole. Therefore, in the case that the two guide pins on the same server node have the same materials, the diameter of the guide pin engaged in the second position limiting hole may be slightly greater than the diameter of the guide pin engaged in the first position limiting hole, and correspondingly, the diameter of the second position limiting hole should also be slightly greater than the diameter of the first position limiting hole. For example, in the case that the diameters of the two guide pins on the server node are 4 mm and 5 mm respectively, the diameter of the first position limiting hole can be set as 4.2 mm, and the diameter of the second position limiting hole can be set as 5.2 mm.

In a preferred embodiment of the present application, the distance from the center of each of the first position limiting hole and the second position limiting hole to the inner wall of the left side wall panel is not less than 10.6 mm and not greater than 11.17 mm.

In a preferred embodiment of the present application, the center of each of first position limiting holes and the center of each of second position limiting holes may be located on the same straight line, and the straight line may be perpendicular to the horizontal plane.

Figure 3:
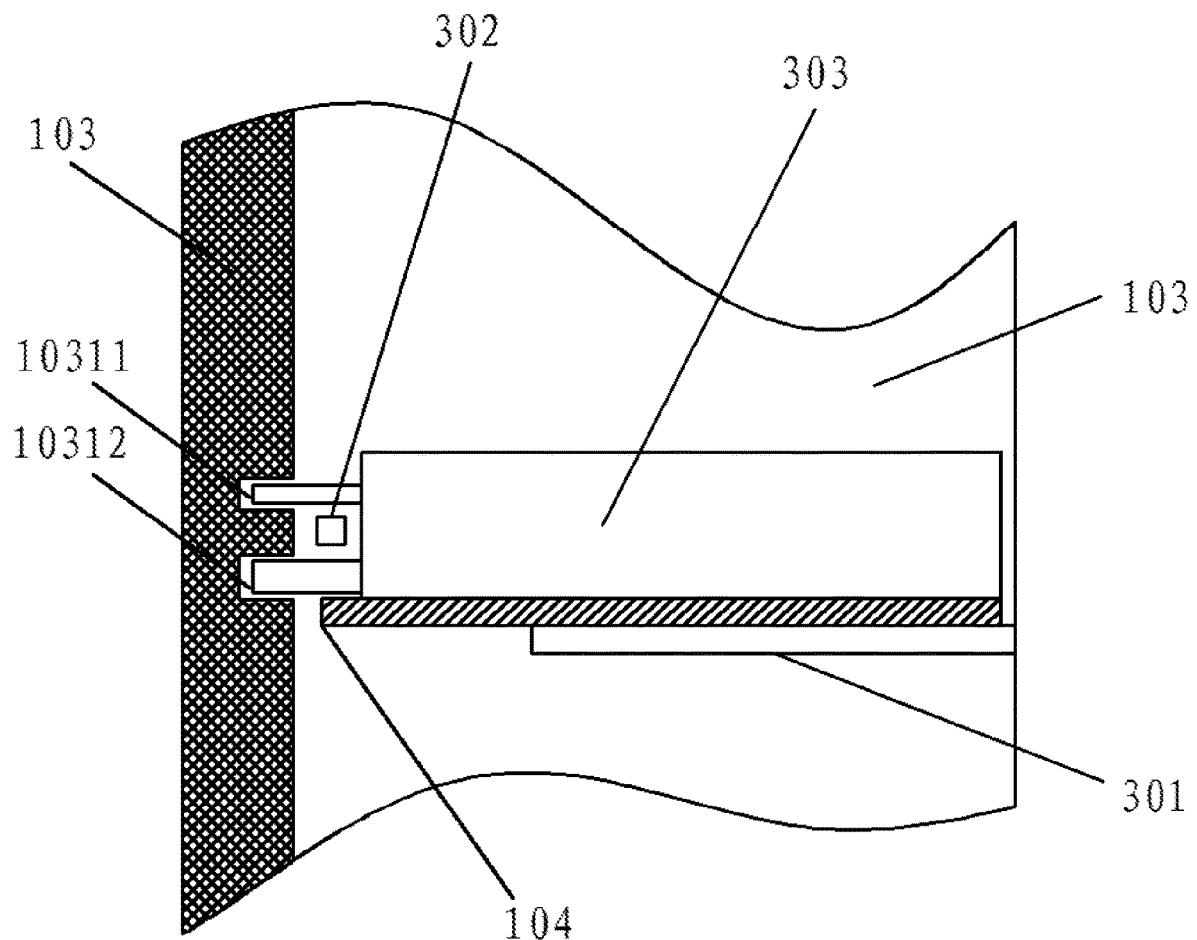
FIG. 3 is a schematic view showing the mounting position relationship between a server cabinet and a server node according to an embodiment of the present application.

Further, in order to facilitate the maintenance and replacement of a failed server node, as shown in FIG. 3, in a preferred embodiment of the present application, the server cabinet further includes at least one set of guide rails 301.

A first guide rail and a second guide rail in each set of the guide rails 301 are arranged on the left side wall panel and the right side wall panel, respectively. The first guide rail and the second guide rail in a same set of guide rails 301 are spaced at equal distances from the horizontal plane.

The at least one mounting plate 104 and the at least one set of guide rails 301 are connected in a one-to-one corresponding manner.

Under the action of an external force, the mounting plate 104 can move linearly toward the rear side wall panel 103 or away from the rear side wall panel 103 along the corresponding set of guide rails 301 connected to this mounting plate 104.

Correspondingly, in order to prevent the server node from moving on the corresponding mounting plate toward the rear side wall panel of the server cabinet and colliding with the rear side wall panel accordingly when the mounting plate moves toward the rear side wall panel of the server cabinet and the server cabinet is tilted towards the rear side wall panel, in a preferred embodiment of the present application as shown in FIG. 3, the server cabinet further includes at least one stop protrusion 302 provided on the left side wall panel 101 or the right side wall panel 102.

The stop protrusion 302 is configured to limit the distance from the external server node 303 mounted on the mounting plate 104 to the rear side wall panel 103 when the mounting plate 104 is moving towards the rear side wall panel 103 along the corresponding set of the guide rails 301 connected to the mounting panel 104.

In order to further save the internal space of the server cabinet, as shown in FIG. 2, in a preferred embodiment of the present application, the rear side wall panel 103 is provided with at least one connection hole 1032.

The connection hole 1032 is configured to enable an external server node backboard to be correspondingly connected to each external server node mounted on the at least one mounting plate 104 through the at least one connection hole 1032.

In the above embodiments of the present application, by providing at least one connection hole in the rear side wall panel of the server cabinet, the arrangement area of the connection hole may correspond to a PCEI interface of the server node mounted in the server cabinet, in this way, when the server node is mounted on the mounting plate in the server cabinet, the server node backboard can be connected to the PCIE interface of the server node through the corresponding connection hole, and thus, the server node backboard can be mounted outside the server cabinet to save the internal space of the server cabinet.

Figure 4:
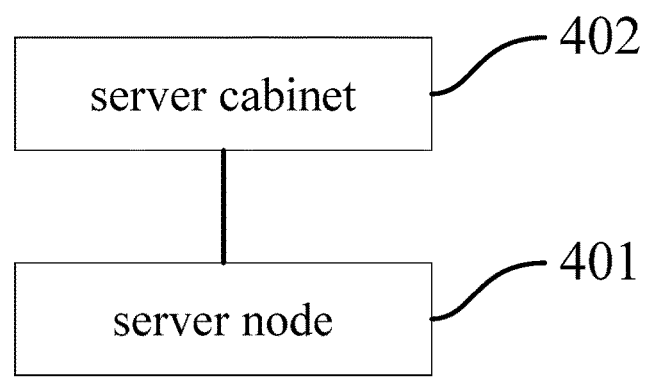
FIG. 4 is a schematic view showing the structure of a server system according to an embodiment of the present application.

As shown in FIG. 4, a server system is provided according to an embodiment of the present application, and includes at least one server node 401 and a server cabinet 402 as described in any one of the above embodiments.

Figure 5:
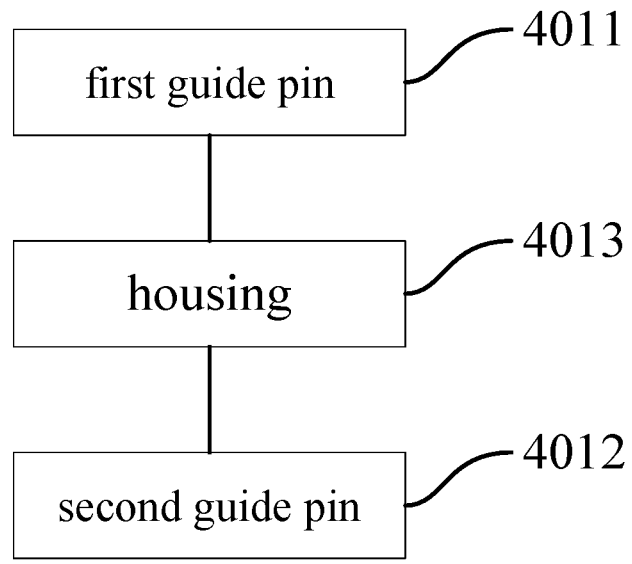
FIG. 5 is a schematic view showing the structure of a server node in a server cabinet according to an embodiment of the present application.

As shown in FIG. 5, in a preferred embodiment of the present application, the server node 401 includes a housing 4011, a first guide pin 4012, and a second guide pin 4013.

The first guide pin 4011 and the second guide pin 4012 are each a cylindrical structure having a circular cross section.

The first guide pin 4011 is configured to engage with the first position limiting hole provided in the rear side wall panel of the server cabinet 402.

The second guide pin 4012 is configured to engage with the second position limiting hole provided in the rear side wall panel of the server cabinet 402.

In the above embodiments of the present application, when installing the server node in the server cabinet, the first guide pin and the second guide pin can be extended into the corresponding first position limiting hole and the corresponding second position limiting hole in the rear side wall panel of the server cabinet respectively, and in this way, the housing of the server node will move toward the left side wall panel or the right side wall panel of the server cabinet on the corresponding mounting plate in the server cabinet, thus preventing the housing from colliding with the left side wall panel or the right side wall panel of the server cabinet, that is, preventing the server node from colliding with the left side wall panel or the right side wall panel of the server cabinet and damaging the server node accordingly.

In a preferred embodiment of the present application, the diameter of the first guide pin 4011 is not less than 3.95 mm and not greater than 4.05 mm.

The diameter of the second guide pin 4012 is not less than 4.95 mm and not greater than 5.05 mm.

Figure 6:
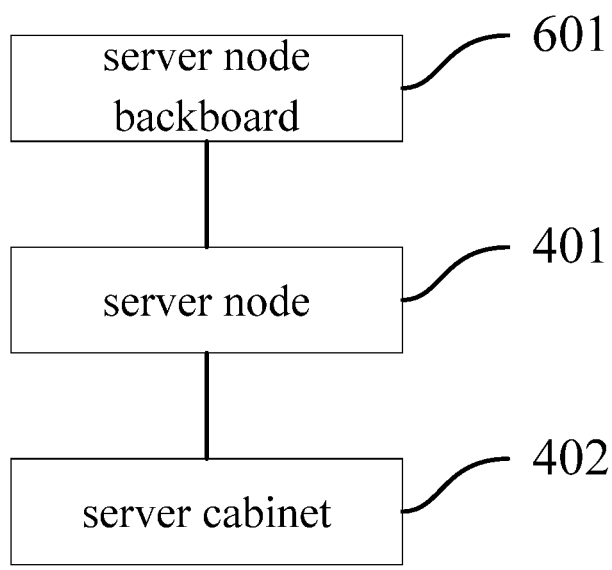
FIG. 6 is a schematic view showing the structure of another server system according to an embodiment of the present application.

As shown in FIG. 6, in a preferred embodiment of the present application, the server system further includes a server node backboard 601. The server node backboard is connected to each of the server nodes.

Figure 7:
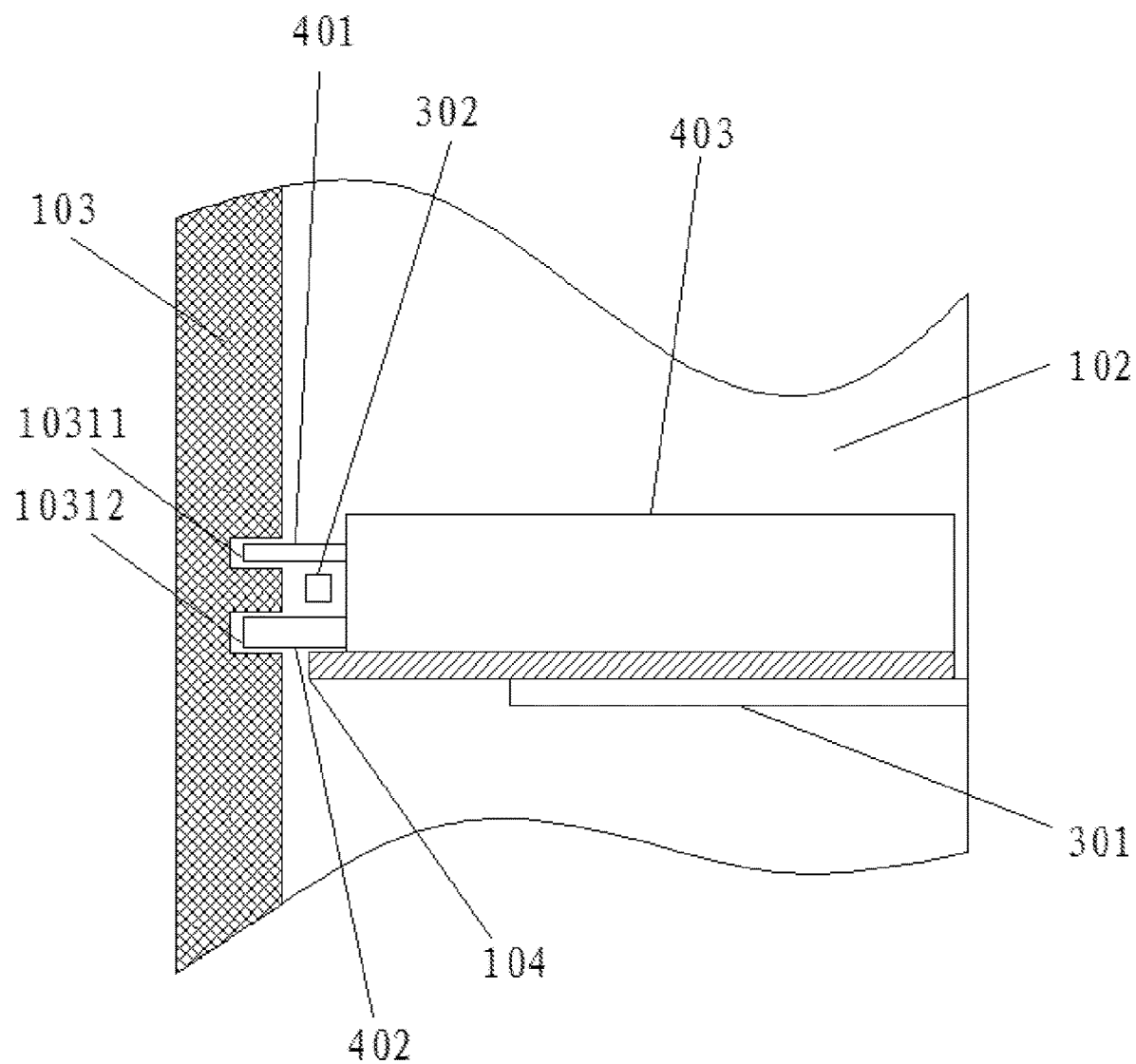
FIG. 7 is a schematic view showing the structure of yet another server system according to an embodiment of the present application.

In order to make the objects, technical solutions and advantages of the embodiments of the present application more clear, the implementation method of utilizing the server cabinet of the embodiment of the present application to mount the server node to prevent the server node from colliding with the server cabinet is further illustrated in conjunction with a server system as shown in FIG. 7.

Referring to FIG. 7, the server node may include a housing 403 and a first guide pin 401 and a second guide pin 402 provided on the housing 403, and other components of the server node, including a memory module and a processor, are arranged within the housing 403. An external force is applied on a mounting plate 104 in the server cabinet, to allow the mounting plate 104 to move away from the rear side wall panel 103 along corresponding guide rails 301 connected to the mounting plate 104, thus withdrawing the mounting plate 104 from the server cabinet. The housing 403 is placed on the mounting plate 104, and the mounting plate 104 is moved toward the rear side wall panel 103 by an external force. Accordingly, the first guide pin 401 can extend into the first position limiting hole 10311 in the rear side wall panel 103 and the second guide pin 402 can extend into the second position limiting hole 10312 in the rear side wall panel 103, that is, the first guide pin 401 is engaged with the first position limiting hole 10311 and the second guide pin 402 is engaged with the second position limiting hole 10312, thereby guiding the housing 403 to move in a right direction, to allow the housing 403 to keep a certain distance from the left side wall panel 101 and the right side wall panel 102 of the server cabinet. Moreover, when the server cabinet is tilted, the housing 403 will not move on the mounting plate 104 towards the left side wall panel or the right side wall panel of the server cabinet, thus preventing the housing 403 from colliding with the left side wall panel or the right side wall panel of the server cabinet, that is, preventing the server node from colliding with the left side wall panel 101 or the right side wall panel 102 of the server cabinet and damaging the server node accordingly.

It should be noted that, as shown in FIG. 7, the stop protrusion 302 provided on the left side wall panel 101 or the right side wall panel 102 of the server cabinet may also limit a distance from the housing 403 to the rear side wall panel 103, to prevent the housing 104 from moving toward the rear side wall panel 103 and accordingly colliding with the rear side wall panel 103 in the process that the mounting plate 104 is moving toward the rear side wall panel 103 or in the case that the server cabinet is tilted toward the rear side wall panel 103, that is, preventing the server node from colliding with the rear side wall panel 103 of the server cabinet and damaging the server node accordingly.

It should also be noted that the rear side wall panel 103 may further be provided with at least one connection hole, to allow the server node backboard to be connected to the server node mounted on the mounting plate 104 through the connection hole, that is, the server node backboard can be mounted outside the server cabinet to save the internal space of the server cabinet.

In conclusion, the embodiments of the present application have at least the following beneficial effects:

1. In a server cabinet according to an embodiment of the present application, at least one mounting plate is connected between the left side wall panel and the right side wall panel, and each of the mounting plates can be used to mount a server node thereon, and the position limiting mechanism provided on the rear side wall panel can limit the relative position between the server node mounted on the mounting plate and this mounting plate, in this way, the server node will not move on the corresponding mounting plate, and thus preventing the server node from colliding with the left side wall panel and the right side wall panel of the server cabinet, and improving the security of the server node.

2. In each set of position limiting holes according to an embodiment of the present application, the first position limiting hole and the second position limiting hole are both circular holes for facilitating the installation and removal of the server nodes and preventing the guide pin on the server node from being stuck in the first position limiting hole or the second position limiting hole. The connection line connecting the center of the first position limiting hole and the center of the second position limiting hole is perpendicular to the horizontal plane, in this way, when the server cabinet is tilted, the guide pins of the server node engaged in the first position limiting hole and the second position limiting hole are uniformly stressed.

3. In an embodiment of the present application, each of the mounting plates can move linearly toward the rear side wall panel or away from the rear side wall panel along corresponding guide rails connected to the mounting plate, thus facilitating the detachment, installation and maintenance of the server node mounted on the mounting plate.

4. In an embodiment of the present application, at least one stop protrusion is provided on the left side wall panel or the right side wall panel of the server cabinet, and can limit the distance from the server node mounted on the mounting plate to the rear side wall panel, thus prevent the server node from moving toward the rear side wall panel and accordingly colliding with the rear side wall panel in the process that the mounting plate is moving toward the rear side wall panel or in the case that the server cabinet is tilted toward the rear side wall panel, that is, preventing the server node from colliding with the rear side wall panel of the server cabinet and damaging the server node accordingly.

5. In an embodiment of the present application, at least one connection hole is provided in the rear side wall panel, to allow the server node backboard to be connected to the PCIE interface of the server node mounted on the mounting plate through the connection hole, that is, the server node backboard can be mounted outside the server cabinet to save the internal space of the server cabinet.

It should be noted that, terms such as first and second are merely used to distinguish an entity or an operation from another entity or operation and do not require or imply that there are any such actual relationships or sequences between these entities or operations herein. Moreover, terms "comprising", "including", or any other variant thereof are intended to encompass a non-exclusive inclusion such that processes, methods, articles, or devices that include a series of elements include not only those elements but also those that are not explicitly listed or other elements that are inherent to such processes, methods, articles, or devices. Without further limitation, the element defined by the statement "comprising one . . . " do not exclude that there are other identical factors in the process, method, article, or device that includes said elements.

It will be understood by the ordinary person skilled in the art that all or a part of the steps for implementing the embodiments of the method described above may be accomplished by means of hardware instructed by program instructions. The aforementioned program may be stored in a computer-readable storage medium, and when the program is executed, the steps including the embodiment of the method described above are executed; and the aforementioned storage medium includes a variety of media, such as ROM, RAM, diskette, or optical disk, which can store program codes.

Finally, it should be noted that the above embodiments are only preferred embodiments of the present application and are merely used to illustrate the technical solution of the present application and are not intended to limit the scope of protection of the present application. Any modifications, equivalent substitutions, improvements, and the like made within the spirit and principle of the present application are deemed to fall into the scope of protection of the present application.

What is claimed is:

1. A server cabinet, comprising: a left side wall panel, a right side wall panel, a rear side wall panel, at least one set of guide rails, and at least one mounting plate connected to both the left side wall panel and the right side wall panel and configured to mount a housing of an external server node, wherein, a first guide rail and a second guide rail in each set of the guide rails are arranged on the left side wall panel and the right side wall panel, respectively, and the first guide rail and the second guide rail in a same set of guide rails are spaced at equal distances from a horizontal plane, the at least one mounting plate and the at least one set of guide rails are connected in a one-to-one corresponding manner, and each of the at least one mounting plate is movable linearly toward the rear side wall panel or away from the rear side wall panel along the respective set of guide rails connected to this mounting plate under the action of an external force; and a position limiting mechanism is provided on the rear side wall panel, and is configured to limit a relative position between the mounting plate and the external server node mounted on the mounting plate, the position limiting mechanism comprises at least one set of position limiting holes provided at a designated position in the rear side wall panel, and each set of the position limiting holes are configured to engage with guide pins on the external server node, to limit a distance from the external server node to the left side wall panel and a distance from the external server node to the right side wall panel, respectively; each set of the position limiting holes comprise a first position limiting hole and a second position limiting hole, wherein, a connection line connecting a center of the first position limiting hole and a center of the second position limiting hole is parallel to a length of the perpendicular to a horizontal plane parallel to the mounting plate, and a distance from the first position limiting hole to the horizontal plane is greater than a distance from the second position limiting hole to the horizontal plane, a diameter of the first position limiting hole is greater than 4 mm, and less than or equal to 4.2 mm, and a diameter of the second position limiting hole is greater than 5 mm, and less than or equal to 5.2 mm; and wherein, the server cabinet further comprises at least one stop protrusion provided on the left side wall panel or the right side wall panel, and the stop protrusion is configured to limit a distance from the server node mounted on the mounting plate to the rear side wall panel in a case that the mounting plate is moving toward the rear side wall panel along the respective set of the guide rails connected to this mounting plate; the rear side wall panel is provided with at least one rectangular connection hole with a length adjacent to the connection line, and the connection hole is configured to allow an external server node backboard to be connected to each external server node mounted on the at least one mounting plate through the at least one connection hole.

2. The server cabinet according to claim 1, wherein, the rear side wall panel is provided with at least one connection hole, and the connection hole is configured to allow an external server node backboard to be connected to each external server node mounted on the at least one mounting plate through the at least one connection hole.

3. The server cabinet according to claim 1, wherein, the rear side wall panel is provided with at least one connection hole, and the connection hole is configured to allow an external server node backboard to be connected to each external server node mounted on the at least one mounting plate through the at least one connection hole.

* * * * *